United States Patent [19]
Tsukamoto

[11] Patent Number: 5,401,666
[45] Date of Patent: Mar. 28, 1995

[54] METHOD FOR SELECTIVE ANNEALING OF A SEMICONDUCTOR DEVICE

[75] Inventor: Hironori Tsukamoto, Kanagawa, Japan

[73] Assignee: Sony Corporation, Tokyo, Japan

[21] Appl. No.: 77,437

[22] Filed: Jun. 17, 1993

[30] Foreign Application Priority Data

Jun. 17, 1992 [JP] Japan ................... 4-158108

[51] Int. Cl.⁶ ............ H01L 21/265; H01L 21/306
[52] U.S. Cl. .......................... 437/41; 437/44; 437/174; 437/907; 437/908
[58] Field of Search ............ 437/41, 44, 174, 247, 437/907, 908, 942, 909; 148/DIG. 3, DIG. 4, DIG. 71, DIG. 80, DIG. 91, DIG. 92, DIG. 93, DIG. 94, DIG 90; 257/408

[56] References Cited

U.S. PATENT DOCUMENTS

| | | | |
|---|---|---|---|
| 4,431,459 | 2/1984 | Teng | 437/41 |
| 4,646,426 | 3/1987 | Sasaki | 437/173 |
| 5,028,552 | 7/1991 | Ushiku | 437/41 |
| 5,028,554 | 6/1991 | Kita | 257/408 |
| 5,032,535 | 7/1991 | Kamijo et al. | 437/41 |
| 5,130,266 | 7/1992 | Huang et al. | 437/44 |

FOREIGN PATENT DOCUMENTS 0072216 8/1982 European Pat. Off. ............ 437/907

Primary Examiner—Olik Chaudhuri
Assistant Examiner—Brian Dutton
Attorney, Agent, or Firm—Hill, Steadman & Simpson

[57] ABSTRACT

XeCl excimer laser annealing for activating a source/drain region of a MOS-FET is carried out without deforming a gate electrode. Generally, a reflectance of a thin film varies in accordance with a cycle of λ/2n due to interference of an incident light and a reflection light. A difference of thickness $d_1$ between a thickness $d_3$ of the film for attaining a maximum reflectance and a thickness $d_2$ for attaining a minimum reflectance is indicated by λ/4n. Thus, a first $SiO_2$ film pattern 8 of the thickness $d_1$ is formed in advance on a gate electrode 7a, and a second $SiO_2$ film 12 is formed on an entire surface of a wafer so that the thickness of the film on the source drain region (a high-concentration impurity diffused region 11 and an LDD region 9) becomes $d_2$. Even under conditions for sufficient heating of the source/drain regions, heat generation of the gate electrode 7a can be controlled, thereby preventing deformation thereof.

2 Claims, 7 Drawing Sheets

FIG.3(a) SAMPLE IRRADIATED AT 700mJ/cm²

FIG.3(b) SAMPLE IRRADIATED AT 900mJ/cm²

CONVENTIONAL DEFORMED GATE

NORMALLY-FORMED GATE OF THE
PRESENT INVENTION

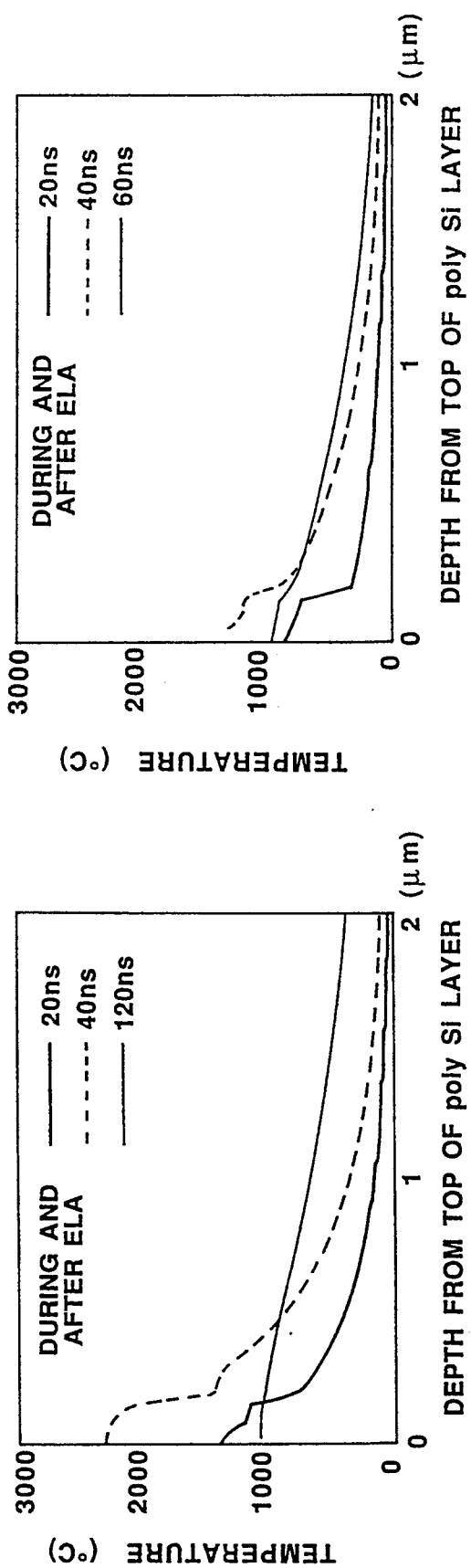
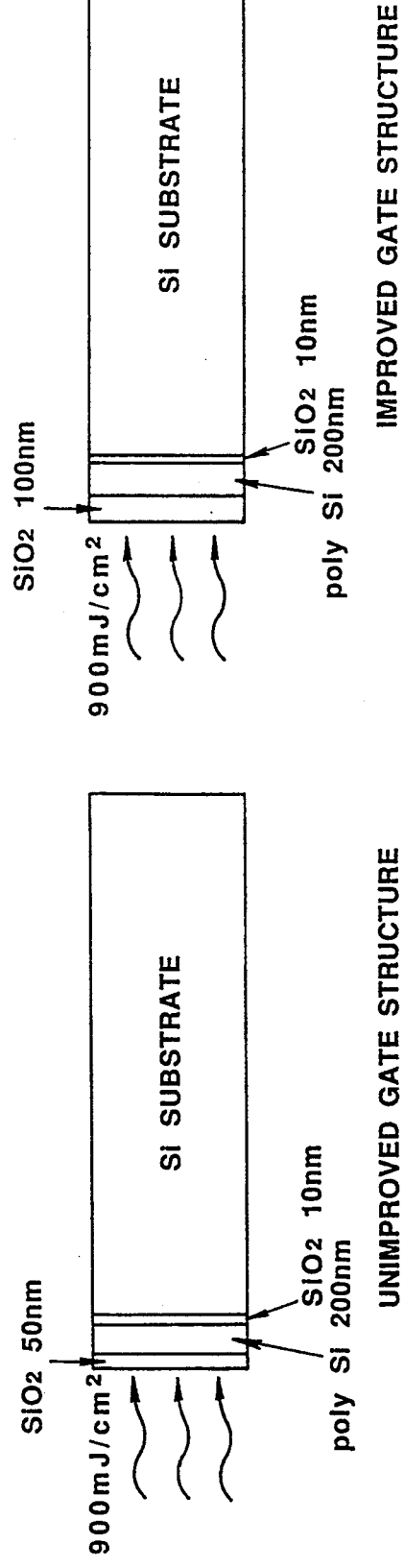
FIG.7(a) UNIMPROVED GATE STRUCTURE
FIG.7(b) IMPROVED GATE STRUCTURE

METHOD FOR SELECTIVE ANNEALING OF A SEMICONDUCTOR DEVICE

BACKGROUND OF THE INVENTION

1. Field of the Invention

This invention relates to a method of producing a semiconductor device. Particularly, it relates to a method whereby, when a region which requires high-temperature heating and a region which should avoid high-temperature heating are intermingled on the same substrate, sufficient thermal treatment can be performed to the former region without having adverse effects on the latter region.

2. Description of the Prior Art

In a manufacture process of a semiconductor device, various kinds of anneal processing (heat treatment) are performed.

For example, in case of forming source/drain regions of an MOS-FET, activation annealing is performed in order to recover crystallinity of a semiconductor substrate disordered by ion implantation, and to electrically activate implanted acceptor ions and donor ions.

Moreover, in a process of silicidation of the surface layer portion of the source/drain regions for reducing contact resistance of MOS-FET, silicidation annealing is performed in a high-temperature range in order to form a silicide layer by a reaction of so-called high fusion point metals, such as W, Mo, and Ti, or precious metals of comparatively high fusion point, such as Pt and Pd, with an Si substrate.

As the method of such annealing, furnace annealing using an electric furnace, rapid thermal annealing (RTA) using an infrared lamp, and laser annealing using a laser light source are conventionally known.

Meanwhile, as large-scale integration of the device proceeds, it becomes necessary to reduce the depth of an impurity diffused region in the source/drain regions, that is, a junction depth, in each MOS-FET. In this case, if activation annealing or silicidation annealing is carried out by furnace annealing or RTA, there is a problem that temperature-rising speed and temperature-falling speed of a substrate become low, thus increasing the junction depth. On the contrary, in laser annealing, one shot of a laser pulse is as short as of the order of picosecond to nanosecond, and the energy of the laser pulse is absorbed mostly within a shallow range of about 20 nm from the surface of an irradiated layer. Thus, the surface of the semiconductor substrate is heated close to the fusion point, and a region to the depth of about 100 nm can be activated. For this reason, laser annealing is highly suitable for activation of the source/drain regions, and particularly for activation of a low-concentration impurity diffused region of LDD (Lightly Doped Drain) structure.

Meanwhile, at the time of activation or silicidation of the source/drain regions of the MOS-FET, it is normal that a gate electrode is already formed. Particularly in a highly integrated semiconductor device, it is often the case that many electrode patterns and metallization patterns of other devices are already formed. Accordingly, at the time of laser annealing, these patterns are heated concurrently. However, a problem has arisen that the patterns are deformed by the heating in connection with a reduction in the design rule.

The electrode pattern and the metallization pattern of the semiconductor device are usually formed on a dielectric film. For example, thermal conductivity (0.014W/cm.deg) of $SiO_2$, which is a typical dielectric, is lower than thermal conductivity (1.5 W/cm.deg) of an Si substrate. For this reason, heat storage proceeds inside the pattern on the $SiO_2$ film, whereby the heat deforms the pattern.

For solving this problem, it is conceivable to control the heat storage in the electrode pattern or the metallization pattern by reducing the laser power. However, with this method, the rate of activation of ions in the LDD region is lowered, thus easily generating adverse effects such as a reduction in operating speed of the MOS-FET due to an increase in resistance, an increase in leakage current due to failure to sufficiently recover crystallinity of the semiconductor substrate, and failure to attain a desired reduction in contact resistance due to insufficient proceeding of silicidation.

For example, a relation between junction depth and sheet resistance in the case of performing XeCl excimer laser annealing (ELA, wavelength of 308 nm) to an Si substrate into which ion implantation of impurities is carried out as shown in FIGS. 1, 2 and 3. The horizontal axis in FIG. 1 indicates a $p^+n$ junction depth (nm) of a $p^+$-type source/drain regions formed by ion implantation of $BF_2^+$ into an n-type Si substrate. The horizontal axis in FIG. 2 indicates an $n^+p$ junction depth (nm) of an $n^+$-type source/drain regions formed by ion implantation of $As^+$ into a p-type Si substrate. The vertical axes in both FIGS. 1 and 2 express sheet resistance ($\Omega/\square$). The ion implantation is carried out via a gate $SiO_2$ film with a thickness of 10 nm, under conditions of implantation such as an ion acceleration energy of 15 keV and a dose amount of $3 \times 10^{15}/cm^2$. Moreover laser annealing is carried out via a reflection control $SiO_2$ film with a thickness of 50 nm. The optical energy density at this time ($mJ/cm^2$) is mentioned by the side of a plot.

FIG. 3 shows characteristics of n-MOS-FET which is formed under the conditions of FIG. 2 with different energy density of ELA and which has a channel length of 0.3 $\mu$m and a channel width of 2 $\mu$m. FIG. 3a shows the characteristics of the sample annealed at 0.7 $J/cm^2$. Poor characteristics of a high leakage current at reverse bias and a low drain current are indicated. It is considered that the energy of ELA is not sufficient to anneal the electrical defects and impurities. A fairly low leakage current and a steep sub-threshold slope with a sufficient drain current are obtained as shown in FIG. 3b. The improved characteristics are considered to be caused by a decrease in electrical defects and sheet resistance due to a high energy irradiation of 0.9 $J/cm^2$.

It is clear that an optical energy density up to about 1100 $mJ/cm^2$ can be used, in order to anneal the source/drain regions sufficiently and to set the junction depth to not more than 100 nm. Actually, however, if the optical energy density exceeds 800 $mJ/cm^2$, the electrode pattern and the metallization pattern are very likely to be deformed. Moreover, if the optical energy is too small, the sheet resistance increases sharply.

It is also conceivable, as another countermeasure to the problem, to change the energy density of the laser in accordance with characteristics of an irradiated portion. However, this countermeasure cannot avoid a drastic reduction in throughput, and thus is not practical.

Thus, it is an object of the present invention to provide a method of producing a semiconductor device whereby deformation of a gate electrode or a metallization pattern can be prevented while a shallow junction of low resistance is formed in a minute MOS-FET.

SUMMARY OF THE INVENTION

According to the present invention, there is provided a method of producing a semiconductor device for performing optical annealing to a substrate having a first region for which annealing is necessary and a second region for which annealing is essentially unnecessary intermingled thereon, the method comprising providing a reflection control film, on an entire surface of the substrate, having a thickness controlled so as to minimize reflectance of annealing light on the first region and maximize the reflectance of annealing light on the second region.

According to the present invention, there is also provided the method producing a semiconductor device wherein at least a surface layer portion of the second region has a refractive index substantially equal to the first region.

According to the present invention, there is also provided the method of producing a semiconductor device wherein the first region is source/drain region of a MOS-FET and the second region is a gate electrode.

According to the present invention, there is also provided the method of producing a semiconductor device wherein the reflection control film is a dielectric film.

According to the present invention, there is further provided the method of producing a semiconductor device wherein the optical annealing is carried out by laser irradiation.

BRIEF DESCRIPTION OF THE DRAWINGS

FIGS. 7(a) and 7(b) show simulated temperature profiles during ELA at an energy density of 0.9 J/cm². FIG. 7a shows an unimproved gate structure with a low reflection $SiO_2$ film of 50 nm, and FIG. 7b shows an improved gate structure with high reflection $SiO_2$ film of 100 nm.

FIG. 8b shows a state in which the gate electrode is patterned and in which an LDD region is formed by ion implantation. FIG. 8c is a state in which sidewalls are formed on sidewall sections of the gate electrode and in which a high concentration impurity diffused region is formed by ion implantation. FIG. 8d shows a state in which a second $SiO_2$ film is formed on an entire surface of a wafer and in which laser annealing is carried out.

DESCRIPTION OF THE PREFERRED EMBODIMENTS

Figure 1:
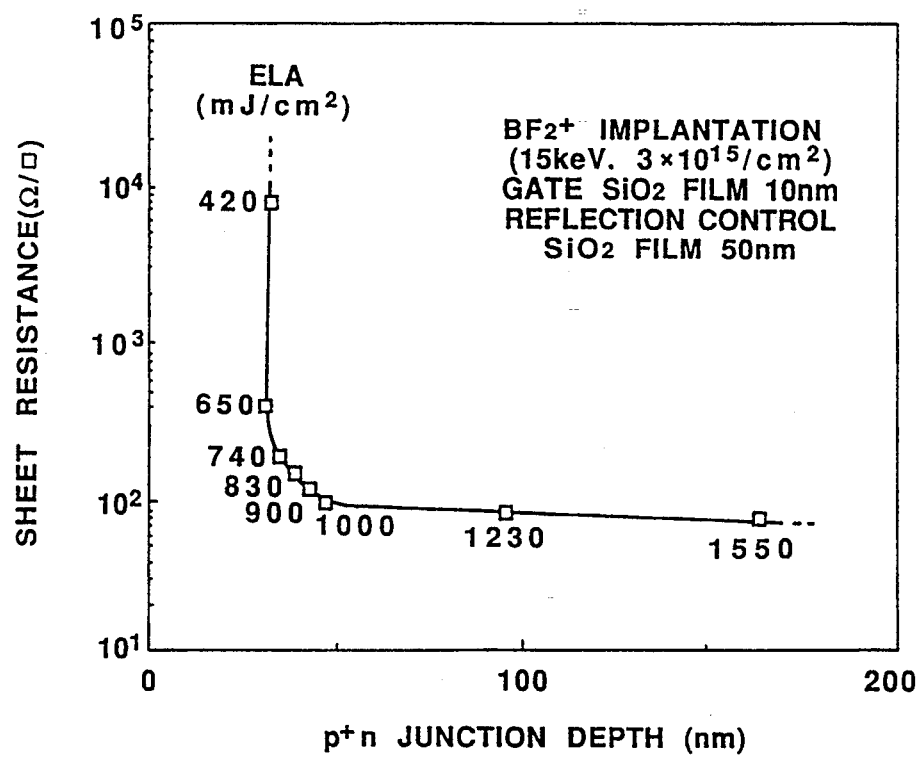
FIG. 1 is a graph showing a relation of change between a p+n junction depth and sheet resistance due to optical energy density at the time of XeCl excimer laser annealing (ELA).
Figure 2:
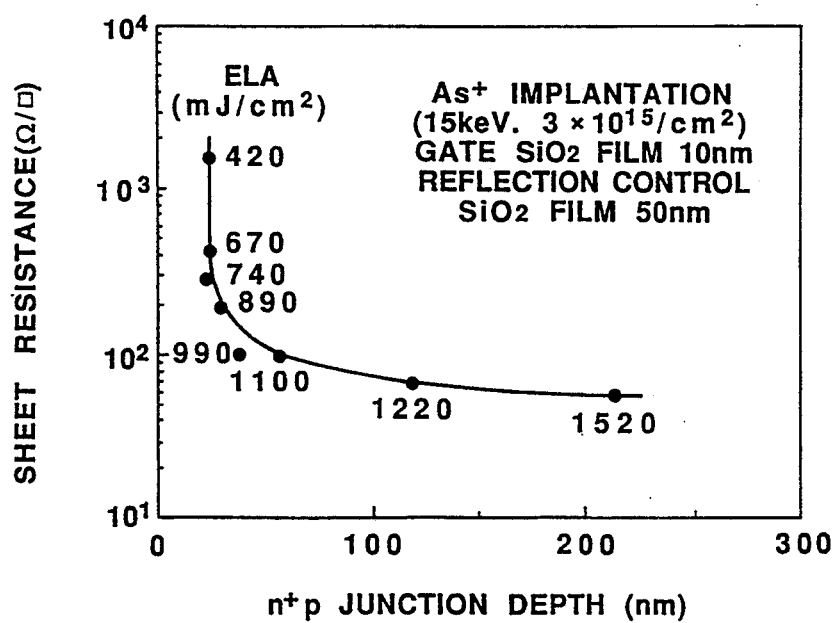
FIG. 2 is a graph showing a relation of change between an n+p junction depth and sheet resistance due to an optical energy density at the time of XeCl excimer laser annealing (ELA).
Figure 3:
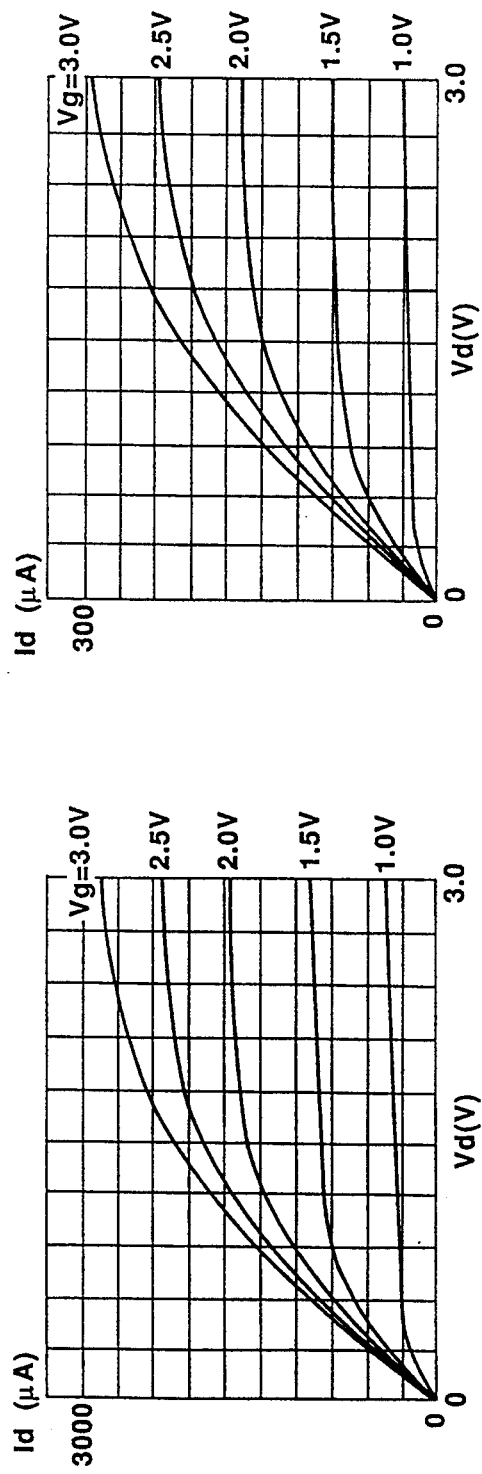
FIGS. 3(a) and 3(b) show Id-Vd and Id-Vg characteristics of 0.3 μm n-channel MOS-FETs fabricated under conditions of ELA at 0.7 J/cm² in FIG. 3a and at 0.9 J/cm² in FIG. 3b.

In order to realize a method for making possible optical annealing such that the energy density becomes low in a region which should avoid heating such as an electrode pattern or a metallization pattern and becomes high in a region which requires heating such as source/drain regions, the present applicant paid attention to effects of a reflection control film as traditionally applied to laser annealing. For example, in the Japanese Patent KOKAI No. 58-116730, the following method is disclosed. That is, if a laser irradiated to a p-type Si substrate or a p-type Si thin film, most of the laser light will be reflected, and only about 30–40% of optical energy is absorbed. However, if a reflection control film comprised of $SiO_2$ is formed on the substrate or the thin film, the absorption efficiency of the optical energy is improved. The reflection control $SiO_2$ film is used also in the above-mentioned experiment of which data are indicated in FIGS. 1 and 2.

Generally, it is known that if a monochrome light becomes incident on the thin film formed on the substrate, the reflectance changes cyclically in accordance with the thickness of the thin film due to interference of an incident light and a reflective light. The cycle for the change of reflectance is expressed by $\lambda/2n$, where $\lambda$ indicates the wavelength of light and $n$ indicates the refractive index of the thin film.

Figure 4:
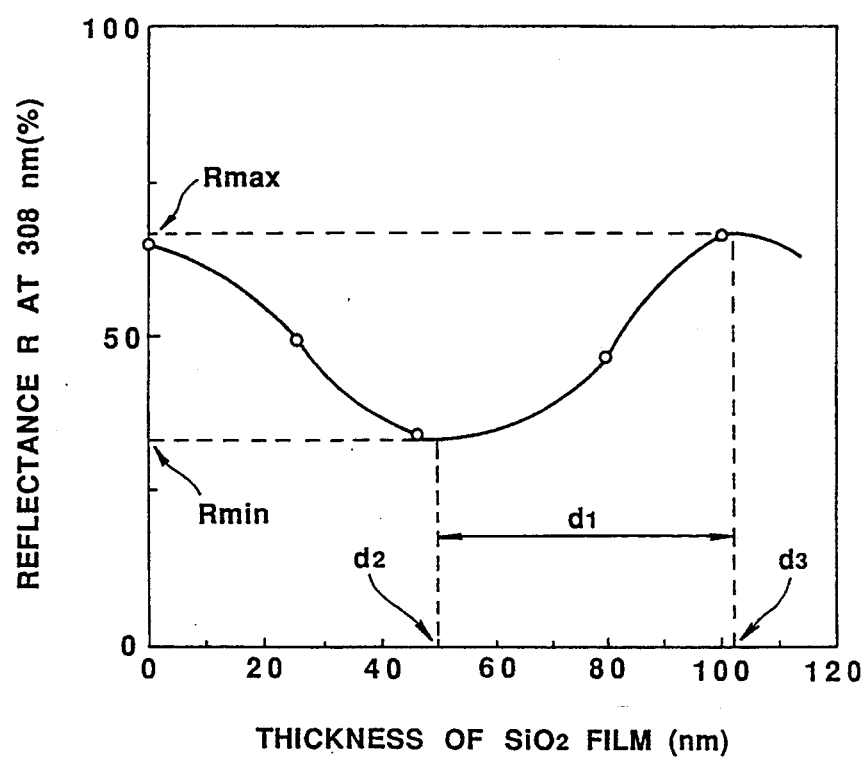
FIG. 4 is a graph showing a relation between thickness of an $SiO_2$ film on a silicon substrate and reflectance at 308 nm.

FIG. 4 shows, as an example, a relation between thickness (nm) of an $SiO_2$ film formed on an Si substrate and reflectance R (%) at an XeCl excimer laser wavelength of 308 nm. The refractive index n of the $SiO_2$ film is 1.48, and the first maximum reflectance $R_{max}$ shown in the figure appears at a thickness $d_3$. The cycle for the maximum reflectance $R_{max}$ to appear is about 105 nm from $\lambda/2n$. Thickness $d_2$ indicating the minimum reflectance $R_{min}$ exists in a mid-point position of the adjacent maximum reflectance $R_{max}$.

Application of the foregoing principle to the present invention yields the following results. That is, in case of performing optical annealing via a reflection control film, if the thickness of the reflection control film is controlled so as to attain the minimum reflectance $R_{min}$ in the first region which requires heating, the transmittance increases and the heating temperature in this region rises. On the contrary, if the thickness of the reflection control film is controlled so as to attain the maximum reflectance $R_{max}$ in the second region which does not essentially require heating, the transmittance decreases and the heating temperature in this region falls. At this time, the difference of the thickness of the reflection control film for attaining the minimum reflectance $R_{min}$ and the thickness for attaining the maximum reflectance $R_{max}$ is an odd multiple of $\lambda/4n$. However, in accordance with the structure of the device, if the gate $SiO_2$ film can be used as part of the reflection control film, the thickness of the reflection control film should be controlled so as to attain the above-mentioned difference in thickness including the thickness of the gate $SiO_2$ film.

Meanwhile, the cyclical change of reflectance as mentioned above naturally varies with a different material of the substrate with the thin film formed thereon. Thus, for practical use, if at least the surface layer portion of the second region has the substantially same reflectance as the first region, it becomes easy to set the thickness of the reflection control film.

In view of the foregoing conditions, one of the practically most important uses of the present invention is activation annealing of the MOS-FET. In short, when the first region is the source/drain regions formed on the Si substrate and when the second region is the gate electrode having the Si based material layer at least in the surface layer portion thereof, the above-mentioned control of the thickness of the reflection control film renders it possible to activate the source/drain regions without deforming the gate electrode and to sufficiently recover crystallinity of the Si substrate.

Further, it is most effective to use the dielectric film of $SiO_2$, etc. for the reflection control film of the present invention, and to carry out optical annealing by laser irradiation which is likely to obtain a monochrome light.

Figure 6:
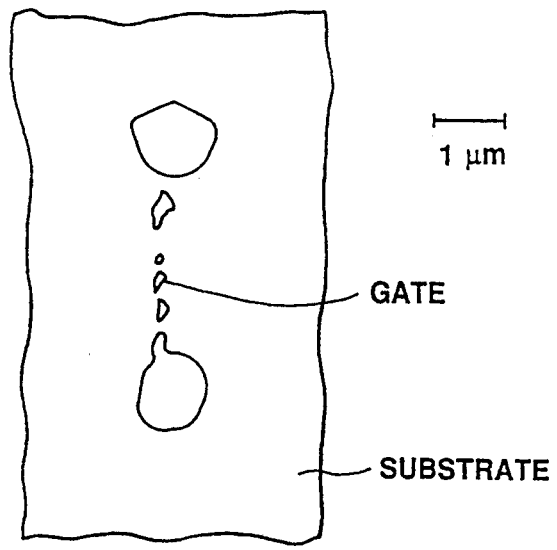
FIGS. 6(a) and 6(b) are SEM micrographs of top views of the gate pattern after ELA, showing an unimproved case in a and an improved case in b.
Figure 6:
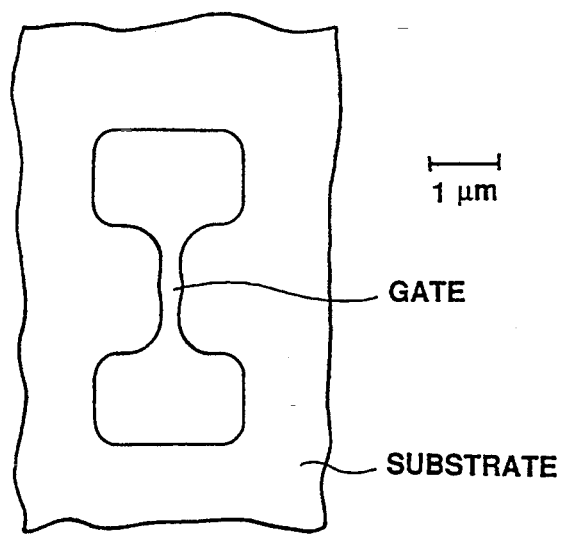

A typical deformed gate pattern of a conventional structure and a gate pattern of the new structure after ELA with an energy density of 1.1 $J/cm^2$ are shown in FIGS. 6a and 6b, respectively. FIG. 6b shows that the gate deformation is prevented for laser irradiation and that a submicron gate of 0.3 $\mu m$ was realized. It is expected that the thermal influence of ELA on the gate is reduced considerably by the reflection films. Simulated temperature profiles during ELA of 0.9 $J/cm^2$ are shown in FIGS. 7a and 7b. It is assumed that the thermal characteristics of gate materials are the same as that of silicon. FIG. 7a a denotes that the temperature of the conventional gate is estimated to be larger than the fusion point of silicon (1410° C.) for a duration of 100 nanoseconds. On the other hand, the temperature profiles for the new gate in FIG. 7b shows that the overheating of the gate is controlled sufficiently against high energy ELA.

A preferred embodiment of the present invention is explained hereinbelow.

In the present embodiment, the present invention is applied to formation of a MOS-FET. The process is explained, referring to FIG. 8.

First, as shown in FIG. 8a, an element separation region 2 was formed by a method such as LOCOS method onto an Si substrate 1, and thermal oxidation was performed to an entire surface of a wafer so as to form a gate $SiO_2$ film 3 with a thickness of about 10 nm. Then, a polysilicon layer 4 containing impurities and a tungsten silicide ($WSi_x$) layer 5 were stacked in order on the entire surface of the wafer, so as to form a so-called tungsten polycide film. Further, a polysilicon layer 6 which contains impurities for the purpose of relaxing stress with an insulation film to be formed in a later process was stacked, for forming a multilayer film 7 consisting of three layers. The multilayer film 7 becomes a gate electrode 7a by patterning, as shown in FIG. 8b.

Furthermore, a first $SiO_2$ layer 8 was formed on the multilayer film 7 by a method such as the usual CVD method. The first $SiO_2$ film 8, together with a second $SiO_2$ layer 12 to be mentioned below as shown in FIG. 8d, constitutes a part of the reflection control film of the present invention. At this time, the setting method of the layer thickness of the first $SiO_2$ film 8 is important.

Since the gate electrode 7a to be formed later is the region which should avoid high-temperature heating, it is preferable to maximize the reflectance of the reflection control film thereon. On the other hand, since source/drain regions constituted by an LDD region 9 and a high-concentration impurities diffused region 11 are regions in which high-temperature heating should be performed for activation of impurity ions, it is preferable to minimize the reflectance of the reflection control film thereon. Thus, from FIG. 4, the thickness of the reflective control film at the time of attaining the maximum reflectance $R_{max}$ is set to $d_3$, and the thickness at the time of attaining the minimum reflectance is set to $d_2$. The thickness of the difference $d_1$ ($=d_3-d_2$) is formed by the first $SiO_2$ film 8 first. This thickness $d_1$ is equivalent to $\lambda/4$, and is about 50 nm in calculation. However, since the thickness $d_2$ also includes the thickness of gate $SiO_2$ film 3 as clearly seen from FIG. 8d to be mentioned later, this thickness was added for forming the first $SiO_2$ film 8 with a thickness of about 60 nm.

Figure 8:
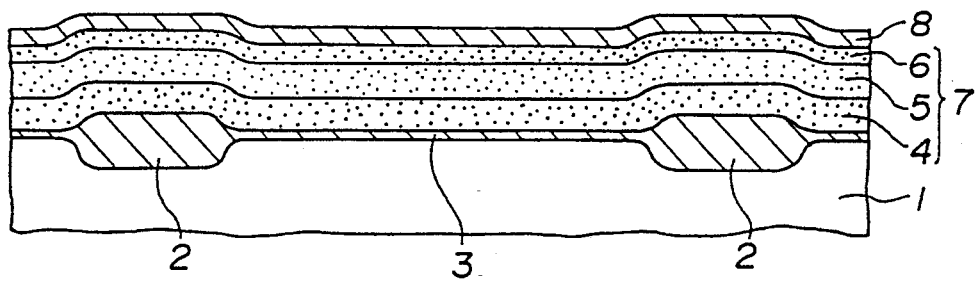
FIGS. 8(a)–8(d) are schematic cross-sectional view showing an example of processes in order, in which the present invention is applied to formation of a MOS-FET. FIG. Sa shows a state in which a multilayer film for forming a gate electrode and a first $SiO_2$ film constituting part of a reflection control film are stacked onto a silicon substrate via a gate $SiO_2$ film.
Figure 8:
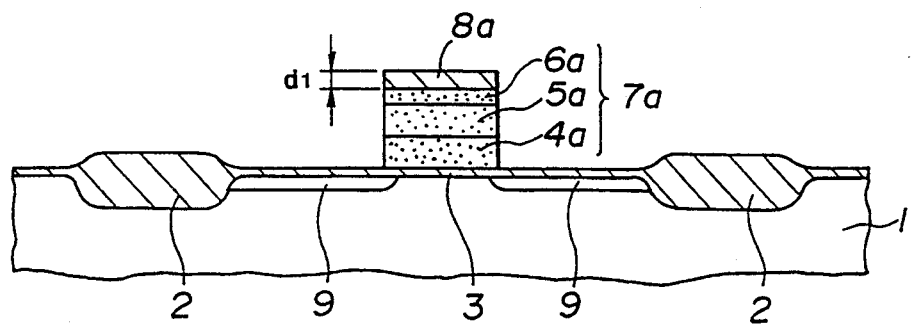
Figure 8:
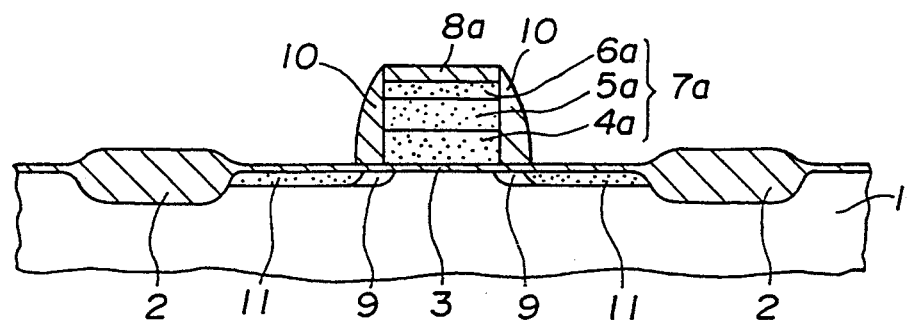
Figure 8:
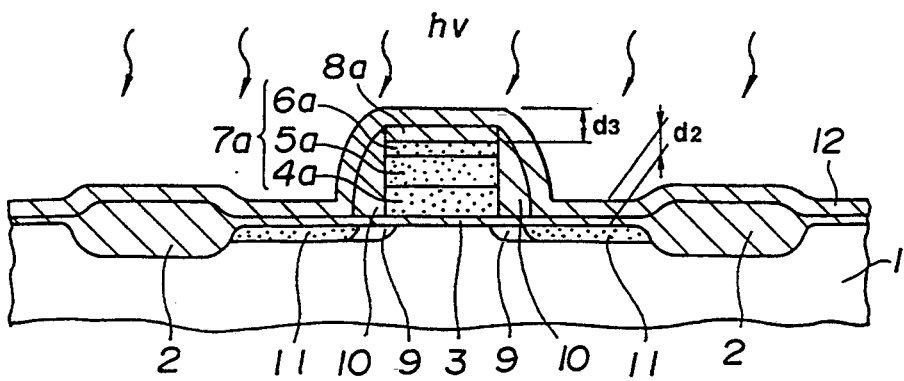

Next, dry etching of the first $SiO_2$ film 8 and the multilayer film 7 was performed in order via resist patterning by the usual photolithography, and a first $SiO_2$ film pattern 8a and the gate electrode 7a were formed, as shown in FIG. 8b. In FIG. 8, a letter a is added to the numeral of the original material layer for expressing the pattern of each material layer formed after etching.

Further, the LDD region 9 constituting the source/drain regions is formed in a self-aligned manner by ion implantation into the Si substrate 1 with the first $SiO_2$ film pattern 8a and the gate electrode 7a serving as masks.

Next, an $SiO_2$ layer, not shown, was formed on the entire surface of the wafer by a method such as the CVD method. Then, the wafer was etched back as shown in FIG. 8c, so as to form sidewalls 10 on sidewall sections of the first $SiO_2$ film pattern 8a and the gate electrode 7a.

Further, the high-concentration impurity diffused region 11 constituting the source/drain regions was formed in the self-aligned manner by another ion implantation into the Si substrate with the first $SiO_2$ film pattern 8a, the gate electrode 7a and the sidewalls 10 serving as masks.

The ions to be implanted may be either of the following in according with the conducting type. $As^+$ may be used for the Si substrate 1 of R type, and $BF_2^+$ may be used for the Si substrate 1 of n type. In both cases, conditions employed are the implantation energy of 5~20 keV and the dose amount of $1 \times 10^{15} \sim 3 \times 10^{15}$ /$cm^2$.

Next, a second $SiO_2$ film 12 was formed on the entire surface of the wafer as shown in FIG. 8d. In this case, it is necessary to form a thickness of $d_2$, that is about 50 nm, to attain the minimum reflectance $R_{min}$ of the reflection control film on the high-concentration impurity diffused region 11 constituting the source/drain regions. However, in the present embodiment, since the thickness $d_2$ of these regions includes the thickness of 10 nm of the gate $SiO_2$ film 3 comprised of $SiO_2$, the second $SiO_2$ film 12 was stacked with a thickness of about 40 nm. On the other hand, the thickness $d_3$ of the reflection control film was achieved on the gate electrode 7a. The thickness $d_3$ of the reflection control film on this portion is the sum of the thickness $d_1$ of the first $SiO_2$ film pattern 8a and the thickness $d_2$ of the second $SiO_2$ film 12, namely about 100 nm. Thus, the difference between the thickness of the reflection control film on the gate electrode 7a and that on the source/drain regions was set to about 50 nm.

When the wafer in this state is irradiated with an excimer laser light (308 nm) with an energy density of 900 mJ/cm² ions implanted in the LDD region 9 and the high-concentration impurity diffused region 11 are sufficiently activated, and crystallinity of the Si substrate 1 is sufficiently recovered, without causing deformation of the gate electrode 7a. In addition, the junction depth did not expand.

Then, covering of the interlayer insulation film, the contact hole processing and formation of upper layer metallization were carried out, thus completing a MOS-FET of low resistance and high reliability.

Meanwhile, the present invention is not limited to the above-mentioned embodiment.

Figure 5:
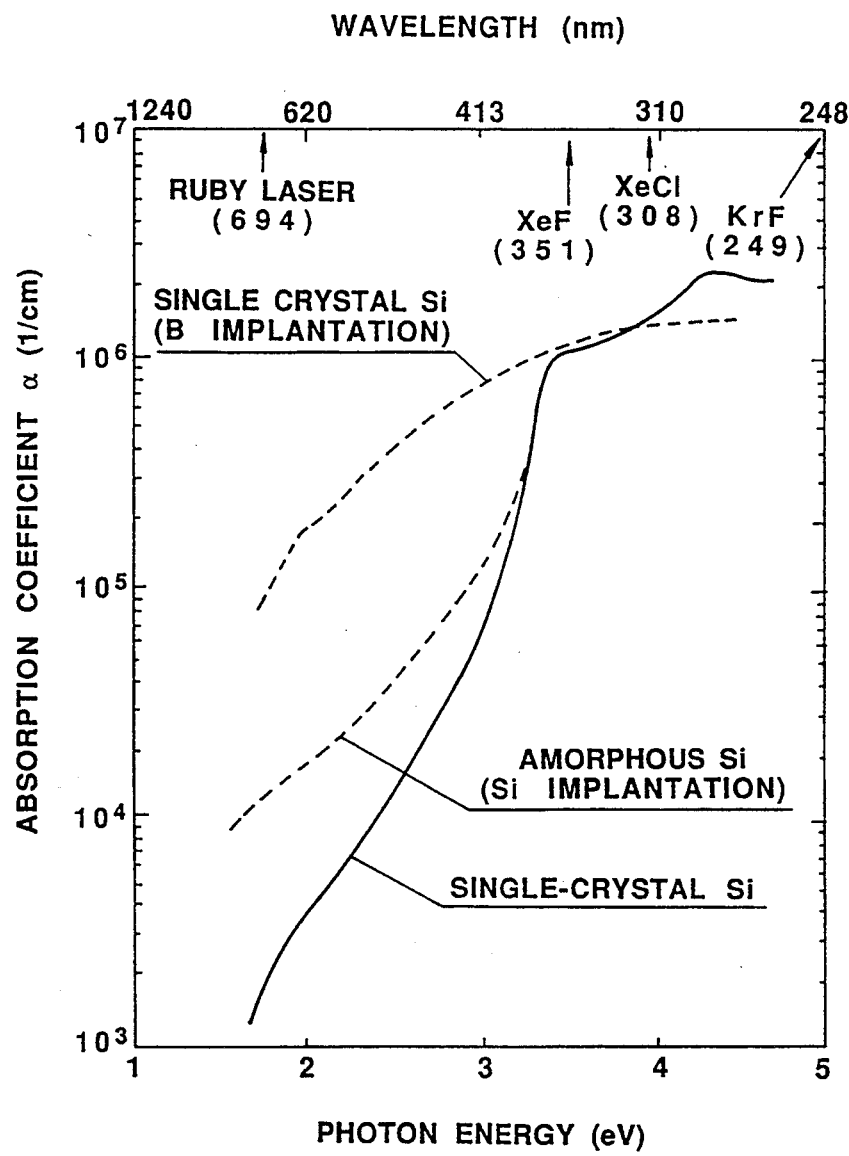
FIG. 5 is a graph showing wavelength or photon energy dependence of an absorption coefficient of various semiconductor materials.

For instance, as the light source for optical annealing, an excimer laser light source such as KeF (351 nm), KrF (249 nm) and ArF (193 nm), or a pulse laser light source such as a ruby laser (694 nm), other than the above-mentioned XeCl (398 nm), may be used. In the above-mentioned embodiment, the XeCl excimer laser was used particularly in consideration of the refractory index of the underlying material of the reflection control film in this range of wavelength. The dependence of the change in reflectance of the reflection control film upon the substrate material has already been described. Data are shown in FIG. 5, in which the change in refractory index due to wavelength of various semiconductor materials is measured by the change of absorption coefficient in a constant relation with the refractory index. It is found that absorption coefficients of non-doped single crystal Si and of single crystal with B implanted therein are substantially the same, in the range of wavelength of XeCl or XeF. That is, changes in characteristics of the Si substrate due to ion implantation of B can be ignored, and the thickness of the reflection control film is easily designed.

Further, the material constituting the reflection control film may be $SiN_x$ (silicon nitride) or $SiO_xN_y$ (silicon oxide nitride), other than the above-mentioned $SiO_2$.

The thickness of the reflection control film may be determined on the basis of the material of the reflection control film and the wavelength of the employed light source. The difference $d_1$ between the thickness $d_3$ for attaining the maximum reflectance $R_{max}$ and the thickness $d_2$ for attaining the minimum reflectance $R_{min}$ is not limited to $\lambda/4n$ as in the above embodiment, but may be selected to be an odd multiple of it. In addition, $d_3$ is not necessarily larger than $d_2$. However, in order to prevent an increase in steps on the wafer surface and to improve step covering property of the interlayer insulation film and the upper layer metallization in the later process, it is preferable to control $d_1$ to the minimum possible value.

The region which does not essentially require annealing may be a general metallization pattern, other than the above-mentioned gate electrode.

In the prior art used the change in reflectance due to the change in the thickness of the thin film is utilized for improvement of annealing characteristics. For instance, a technique to cover a polysilicon layer with an $SiO_2$ film having partially different thicknesses, in single crystallization of a polysilicon thin film by CW-Ar laser irradiation, is disclosed in the Japanese Patent KOKAI No. 58-53823. However, the object of this technique is to uniformize annealing temperatures in case where a single material layer (polysilicon layer) is extended over a plurality of material layers of different thermal conductivities, such as an Si substrate and an $SiO_2$ film. Thus, the object of this technique is different from that of the present invention.

Also, the present applicant previously proposed, in the Japanese Patent KOKAI No. 3-283611, a technique to make a difference in thickness of a reflection control film between a low-concentration impurity diffused region (LDD) and a high-concentration impurity diffused region, in order to change the annealing temperature between the two regions when activating, by laser annealing, source/drain regions of a MOS-FET having an LDD structure. However, the object of this technique is to generate the difference in temperature between the regions both of which require heating, and thus is different from the object of the present invention, which is to protect the region requiring no heating.

As is clear from the above description, with the present invention, even if the laser light with the energy density fixed to a predetermined value is irradiated to the substrate having the region which should be heated and the region which should avoid heating intermingled, it becomes possible to prevent adverse effects on the latter region while sufficiently annealing the former region. Accordingly, the present invention is extremely effective in case of forming the MOS-FET based on minute design rules.

Although various minor changes and modifications might be proposed by those skilled in the art, it will be understood that I wish to include within the scope of the patent warranted hereon all such changes and modifications as reasonably come within my contribution to the art.

What is claimed is:

1. A method of producing a semiconductor device comprising the steps of:

forming a gate oxide layer of a silicon oxide having a first thickness on a surface of a semiconductor substrate;

depositing a gate electrode material layer containing polysilicon on said gate oxide layer;

forming a first reflection control layer of a silicon oxide having a second thickness on said gate electrode material;

etching said gate electrode material and said first reflection control layer for forming a gate electrode;

implanting conductive impurities into said semiconductor substrate by using said gate electrode as a mask for forming lightly doped drain and source regions;

depositing a silicon oxide layer over said semiconductor substrate and said gate electrode;

etching back said silicon oxide layer for forming sidewalls adjacent said gate electrode;

implanting conductive impurities into said semiconductor substrate for forming drain and source regions at said lightly doped drain and source regions by using said gate electrode and said sidewalls as masks;

forming a second reflection control layer of a silicon oxide over said semiconductor substrate, said gate electrode and said sidewalls;

selecting a difference between said first thickness and said second thickness to maximize reflectance of an annealing laser light on the gate electrode and to minimize reflectance of the annealing laser light on the drain and source regions; and annealing said semiconductor substrate by said annealing laser light.

2. A method for controlling annealing in the manufacture of a semiconductor device, comprising the steps of:

providing a semiconductor substrate having a source region and a drain region;

providing a gate electrode located over a surface of a region in said semiconductor substrate which is located between said source region and said drain region;

providing a reflection control layer over said gate electrode having a first thickness;

providing another reflection control layer on said source and drain regions having a second thickness;

selecting said first and second thicknesses of said reflection control layer and said another reflection control layer to provide a maximum value of reflectance during a subsequent anneal at said gate electrode and a minimum value of reflectance at said source and drain regions during said same subsequent anneal; and annealing with a laser light the semiconductor substrate such that the selection of the first thickness at least reduces annealing at the gate electrode and the selection of the second thickness allows annealing of the source and drain regions when said annealing light is simultaneously exposed on the substrate at a region of said gate electrode and of said source and drain regions.

* * * * *